(12) United States Patent
Chang et al.

(10) Patent No.: US 7,312,573 B2
(45) Date of Patent: Dec. 25, 2007

(54) ORGANIC LIGHT EMITTING DIODE DEVICES

(75) Inventors: Che-Chih Chang, Toufen Township, Miaoli County (TW); Han-Ping Kuo, Taipei (TW); Chia-Jung Wu, Dalin Township, Chiayi County (TW); Li-Hui Chen, Hsinchu (TW); Chin-Kun Hsieh, Hsinchu (TW); Chi-Chung Lo, Youngjing Township, Changhua County (TW)

(73) Assignee: AU Optronics Corp., Hsinchu (TW)

( * ) Notice: Subject to any disclaimer, the term of this patent is extended or adjusted under 35 U.S.C. 154(b) by 224 days.

(21) Appl. No.: 11/193,196

(22) Filed: Jul. 29, 2005

(65) Prior Publication Data
US 2006/0132031 A1 Jun. 22, 2006

(30) Foreign Application Priority Data
Dec. 16, 2004 (TW) ............... 93139126 A (51) Int. Cl.
*H05B 33/00* (2006.01)
(52) U.S. Cl. ...................................... 313/512
(58) Field of Classification Search ........ 313/498–512; 428/917, 690
See application file for complete search history.

(56) References Cited

U.S. PATENT DOCUMENTS

| 3,560,728 | A | * | 2/1971 | Atkin | ................... 362/294 |
| 3,646,409 | A | * | 2/1972 | van de Water et al. | ..... 257/675 |
| 5,821,692 | A | | 10/1998 | Rogers et al. | .............. 313/512 |
| 6,265,820 | B1 | | 7/2001 | Ghosh et al. | ............... 313/483 |
| 6,617,052 | B2 | | 9/2003 | Morii | |
| 7,202,602 | B2 | * | 4/2007 | Anandan | .................. 313/512 |
| 2001/0044035 | A1 | | 11/2001 | Morii | |

FOREIGN PATENT DOCUMENTS

CN 1317922 10/2001

OTHER PUBLICATIONS

CN Office Action mailed May 11, 2007.

* cited by examiner

*Primary Examiner*—Joseph Williams
(74) *Attorney, Agent, or Firm*—Thomas, Kayden, Horstemeyer & Risley (57) ABSTRACT

Organic light emitting diode (OLED) devices with heat dissipation elements for electronic devices. The OLED devices comprise an OLED module and a frame enclosing the OLED module, wherein the frame comprises an exposing portion to outside the electronic device.

19 Claims, 7 Drawing Sheets

ORGANIC LIGHT EMITTING DIODE DEVICES

BACKGROUND

The invention relates to organic light emitting diode (OLED) devices, and more particularly, to frames integrated with heat dissipation elements for OLED devices.

Among flat panel displays, organic light emitting diode (OLED) displays exhibit characteristics of self-emission, high brightness, wide viewing angle, high response and simple fabrication process, making them popular for the next generation of flat panel displays.

According to driving methods, organic light emitting diode (OLED) displays can be divided into passive matrix light emitting diode (PM-OLED) and active matrix organic light emitting diode (AM-OLED), with the latter more commonly used in flat panel display applications.

Conventionally, it is known that a passive matrix organic light emitting diode (PM-OLED) display is driven to display images by XY matrix electrodes, employing sequential line drive. If the number of scan lines is in the hundreds, the required instantaneous brightness is several hundred times that of the observed brightness. Thus, the instantaneously passed electrical current becomes several hundred times larger and extreme heat is generated resulting in increased operating temperature. Since the deterioration rate of organic light emitting layers is indirect ratio to the operating temperature thereof, however, the luminescent efficiency and lifetime of the OLED device are thereby adversely affected.

One trend in OLED device technology is for higher luminescent efficiency and longer lifetime. As a result, an AM-OLED device with thin film transistors has been provided to solve the aforementioned problems. The AM-OLED device provides panel luminescence with thin and lightweight characteristics, spontaneous luminescence with high luminescent efficiency at low driving voltage, and increased viewing angle, high contrast, high response speed, flexibility, and full color. As the need for larger display devices with higher resolution grows, AM-OLED devices look to become a major trend.

The AM-OLED devices can reduce current through the OLED, thereby controlling overheating. AM-OLED devices, however, typically use thin film transistors (TFTs) as switch devices through which high current passes. Since TFT channels are semiconductor materials such as amorphous silicon or polysilicon, resistance thereof can convert current therethrough to heat, increasing the operating temperature of the OLED device. As the operating temperature, for OLEDs with glass transition temperature (Tg) of about 100° C., increases, the lifetime of the OLED device is reduced. That is, higher operating temperatures cause incremental degradation of the OLED device.

Accordingly, in order to dissipate heat generated by AM-OLED displays, U.S. Pat. No. 6,265,820, the entirety of which is hereby incorporated by reference, discloses a multi-level thermal dissipation structure. Furthermore, U.S. Pat. No. 5,821,692, the entirety of which is hereby incorporated by reference, discloses thermal dissipation fins disposed on the frame to improve dissipation efficiency. Both disclosed OLED displays, however, are restricted by strength and thickness requirements. For example, the multi-level heat dissipation structures can increase total thickness of the OLED devices, and thermal dissipation fins structures may affect the strength of the OLED devices, causing difficulties in assembly.

SUMMARY

Organic light emitting diode devices with heat dissipation elements are provided by employing frames with heat conducting elements and heat dissipation elements, thereby effectively conducting heat generated by the OLED devices to ambient environment.

The invention provides an organic light emitting diode (OLED) device for an electronic device. The OLED device comprises an OLED module and a frame enclosing the OLED module, wherein the frame comprises a portion exposed to outside the electronic device.

The invention further provides an organic light emitting diode (OLED) device for an electronic device. The OLED device comprises an OLED module, a frame enclosing the OLED module, and a heat dissipating element with one end disposed on the OLED module and the other end extending outside the electronic device.

DESCRIPTION OF THE DRAWINGS

The invention will be better understood with reference to the descriptions to be read in conjunction with the accompanying drawings, in which.

DETAILED DESCRIPTION

Embodiments of the invention provide electronic devices comprising an OLED device with an outer frame integrated with a heat dissipation element. The OLED device comprises an OLED module, a frame, a heat conducting element and a heat dissipation element. The OLED module comprises a substrate, an organic light emitting diode layer, and a passivation layer covering the OLED device. The frame comprises a metal element and a polymer element interlocked with each other and enclosing the OLED module. One end of the heat dissipation element directly contacts the OLED module and the other end of the heat dissipation element has an exposed surface extending outside the electronic device. The exposed surface has a large surface area, directly conducting heat generated by the OLED device to the ambient environment.

The OLED module can be a top emission OLED module or a bottom emission OLED device. Furthermore, the OLED module can comprise an active matrix organic light emitting diode (AM-OLED) module.

Figure 1A:
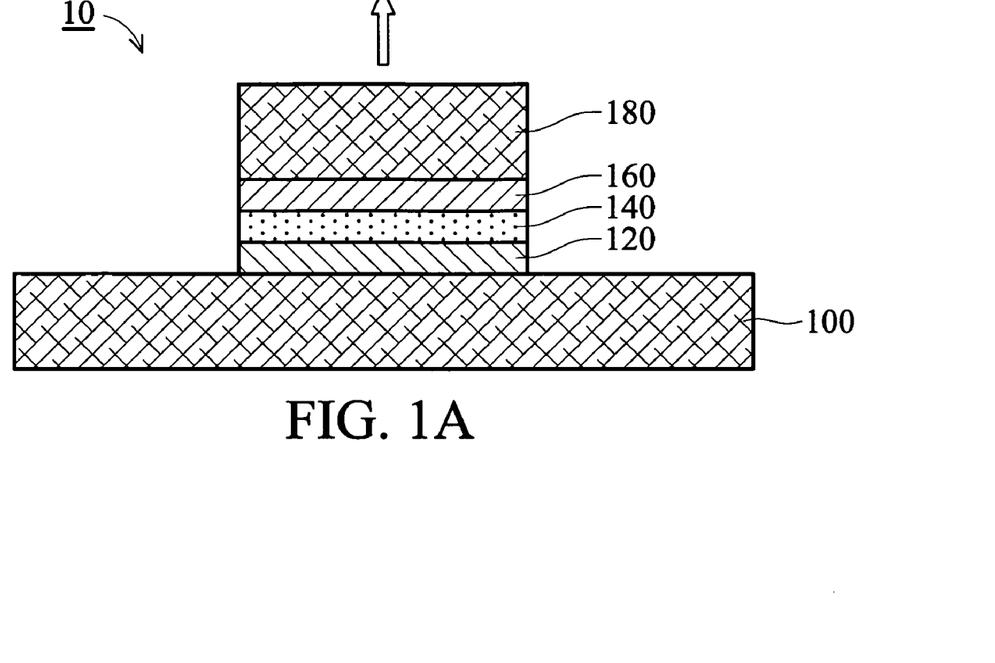
FIG. 1A is a cross section of an exemplary embodiment of a top emission OLED module.

Reference will now be made in detail to embodiments of the invention, examples of which are illustrated in the accompanying drawings. FIG. 1A is a cross section of an exemplary embodiment of a top emission OLED module.

Figure 1B:
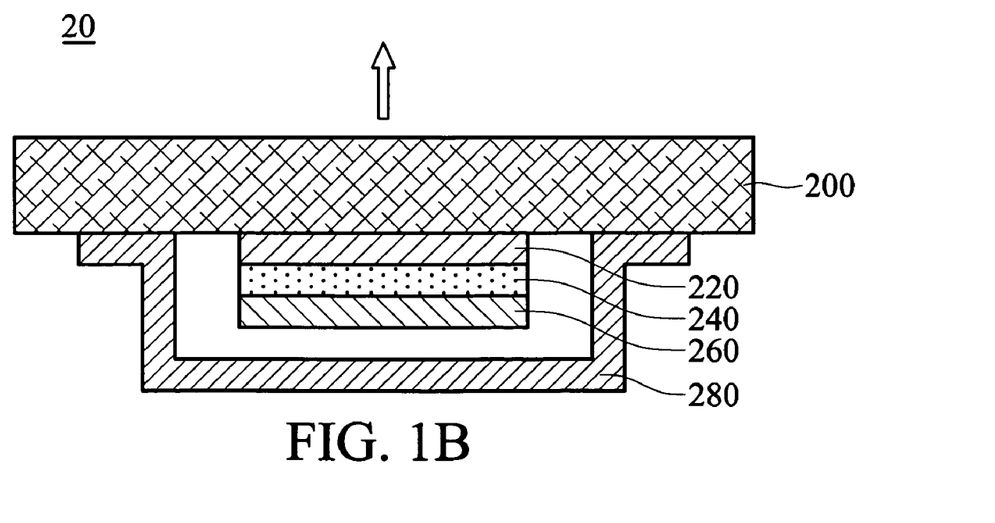
FIG. 1B is a cross section of an exemplary embodiment of a bottom emission OLED module.

FIG. 1B is a cross section of an exemplary embodiment of a bottom emission OLED module.

Referring to FIG. 1A, a top emission OLED module 10 comprises a substrate 100, a first electrode 120, an organic light emitting layer 140, a second electrode 160, and a passivation layer 180 enclosing the organic light emitting layer 140. The first electrode 120, the organic light emitting layer 140, the second electrode 160 compose an organic light emitting diode device.

The substrate 100 is a transparent substrate such as glass or quartz. The first electrode 120 is formed on the substrate by vacuum thermal evaporation or sputtering. The first electrode 120 can be Ca, Ag, Mg, Al, Li, or other low work function materials, or combinations thereof.

The organic light emitting layer 140 is disposed on the first electrode 120. The organic light emitting layer 140 can be small molecule or polymer organic light emitting material. The organic light emitting layer 140 can be a single-layered OLED or multi-layered OLED. The small molecule OLED can be formed by vacuum thermal evaporation. The polymer OLED can be formed by spin coating, inkjet printing, or screen printing.

The second electrode 160 is disposed on the organic light emitting layer 140. The second electrode 160 is a transparent electrode such as indium tin oxide (ITO), indium zinc oxide (IZO), aluminum zinc oxide (AZO), or zinc oxide (ZnO). The second electrode 160 is formed by sputtering, e-beam evaporation, thermal evaporation, chemical vapor deposition, or spray thermal decomposition.

The passivation 180 encloses the OLED device protecting the OLED module 10. The passivation 180 can be a glass substrate or a polymer layer.

As shown in FIG. 1B, a bottom emission OLED module 20 is provided. The operation and structures of the bottom emission OLED module 20 are nearly identical to those of the top emission OLED module 10 of FIG. 1A and for simplicity, detailed description thereof is omitted. The bottom emission OLED module 20 is different from the top emission OLED module 10 in that the first electrode 220 and the second electrode 260 are exchanged. Since the emission light is extracted from the bottom of the OLED module 20, the passion layer can be made of metal to strengthen the OLED module 20.

Exemplary embodiments of the invention are provided to illustrate frames integrated with heat dissipation elements for electronic devices. Note that although each embodiment is illustrated with a bottom emission OLED module, other OLED modules are also applicable to embodiments of the invention.

First Embodiment

Figure 2:
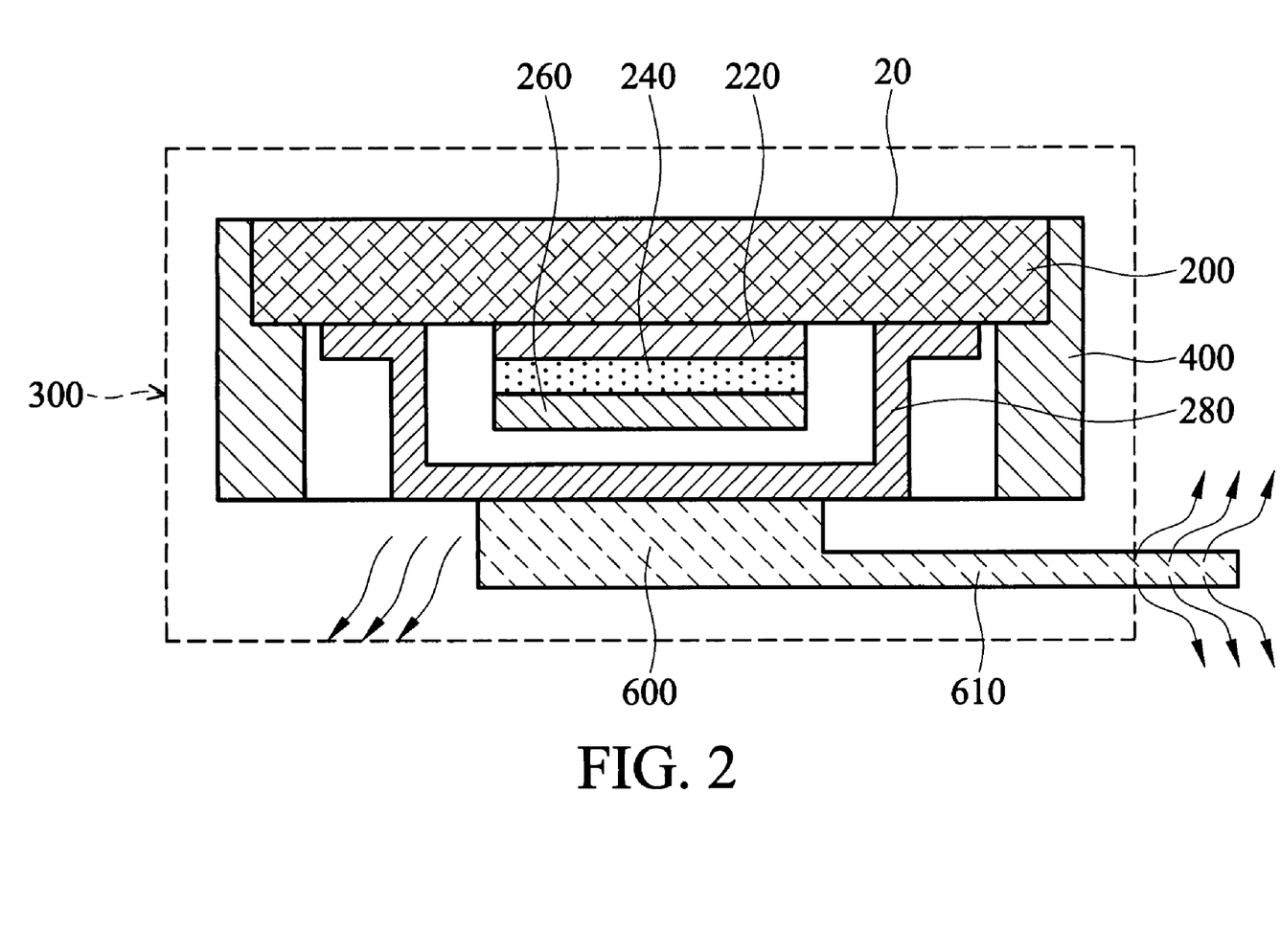
FIG. 2 is a schematic view of an electronic device according to a first embodiment of the invention.

FIG. 2 is a schematic view of an electronic device 300 according to a first embodiment of the invention. The electronic device 300 comprises an OLED module 20, a frame 400, and a heat conducting element 600. The OLED module 20 comprises a substrate 200, a first electrode 220, an organic light emitting layer 240, a second electrode 260, and a passivation structure 280. The OLED module 20 is mounted in the frame 400. The frame 400 is a polymer element enclosing the OLED module 20. The heat conducting element 600 directly contacts the passivation structure 280 having an exposed surface to conduct heat generated by the OLED module 20 to ambient environment outside the electronic device. The heat conducting element 600 can be Al, Al—Cu alloy, Mg, Mg—Al alloy, stainless steel, galvanized iron, tin coated iron plate, or combinations thereof.

The heat conducting element 600 may comprise an extended portion 610 extending to ambient environment outside the electronic device, thereby dissipating heat generated by the OLED module 20 to the ambient environment.

Second Embodiment

Figure 3:
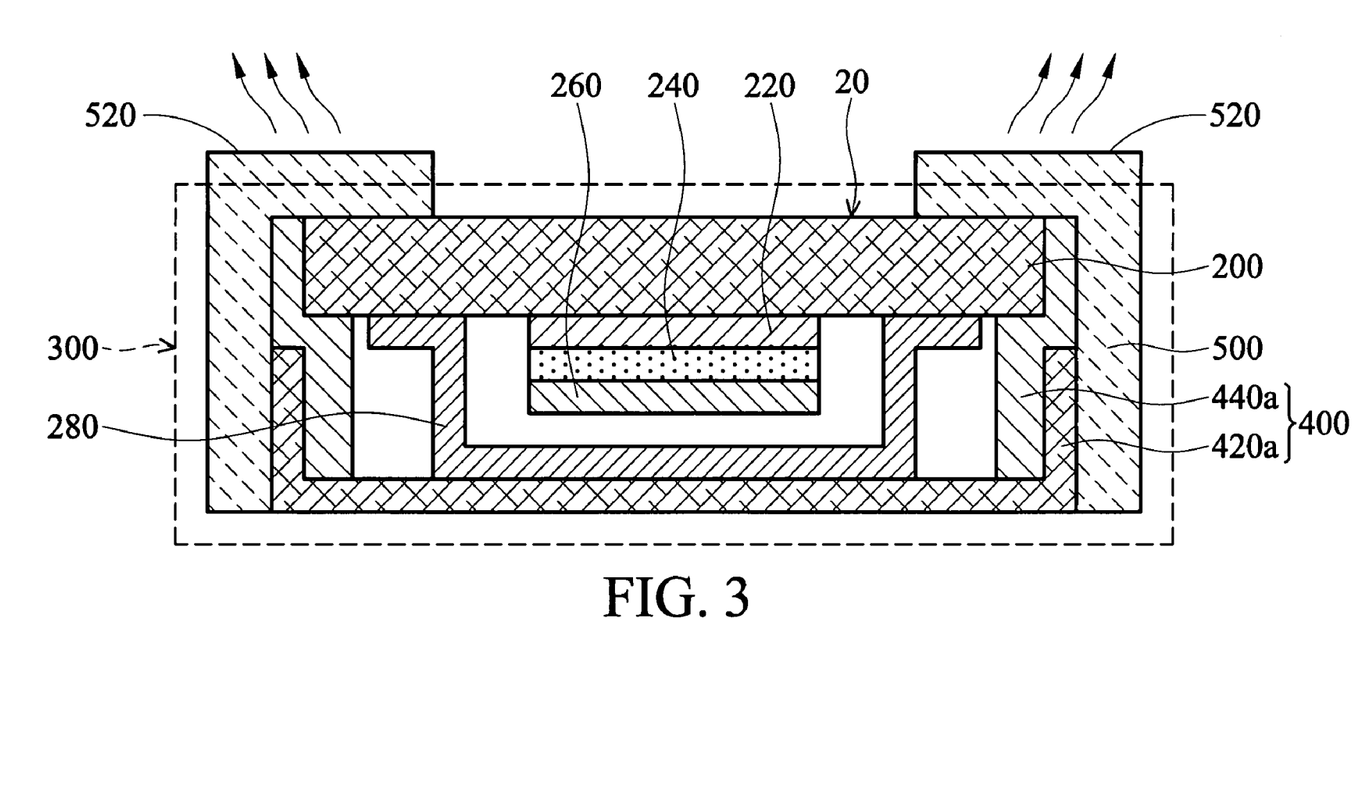
FIG. 3 is a schematic view of an electronic device according to a second embodiment of the invention.

FIG. 3 is a schematic view of an electronic device 300 according to a second embodiment of the invention. The electronic device 300 comprises an OLED module 20, a frame 400, and a heat dissipation element 500. The OLED module 20 comprises a substrate 200, a first electrode 220, an organic light emitting layer 240, a second electrode 260, and a passivation structure 280. The OLED module 20 is mounted in the frame 400. The frame 400 can comprise a metal element 420a and a polymer element 440a interlocked with each other. The metal element 420a is Al, Al—Cu alloy, Mg, Mg—Al alloy, stainless steel, galvanized iron, tin coated iron plate, or combinations thereof. The heat dissipation element 500 encloses the frame 400 with an inner surface directly contacting the frame 400 and an exposed surface 520 to dissipate heat generated by the OLED module 20. The exposed surface 520 has a large surface area. The heat dissipation element 500 can be Al, Al—Cu alloy, Mg, Mg—Al alloy, stainless steel, galvanized iron, tin coated iron plate, or combinations thereof.

Third Embodiment

Figure 4:
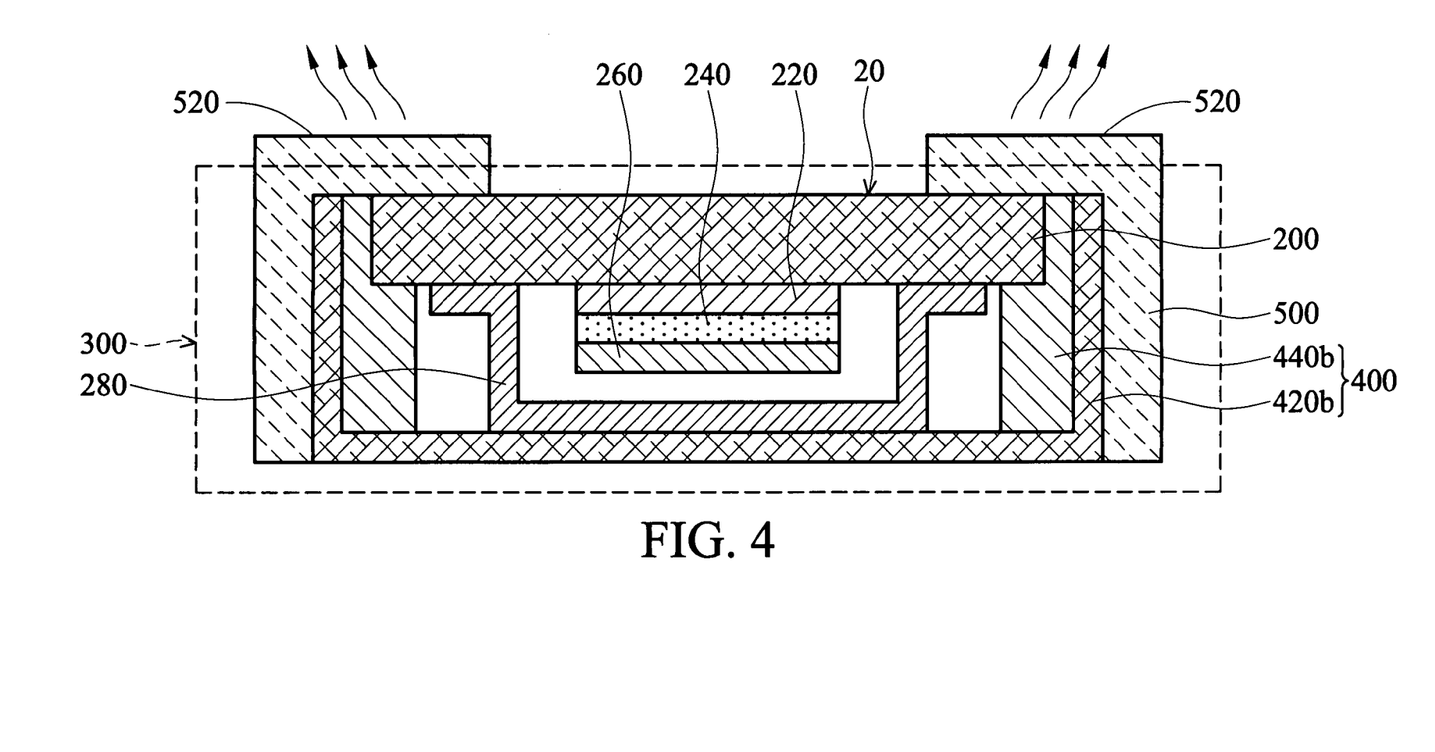
FIG. 4 is a schematic view of an electronic device according to a third embodiment of the invention.

FIG. 4 is a schematic view of an electronic device 300 according to a third embodiment of the invention. The electronic device 300 comprises an OLED module 20, a frame 400, and a heat dissipation element 500. The OLED module 20 comprises a substrate 200, a first electrode 220, an organic light emitting layer 240, a second electrode 260, and a passivation structure 280. The OLED module 20 is mounted in the frame 400. The frame 400 can comprise a metal element 420b and a polymer element 440b interlocked with each other. The metal element 420b encloses the polymer element 440b. The metal element 420b is Al, Al—Cu alloy, Mg, Mg—Al alloy, stainless steel, galvanized iron, tin coated iron plate, or combinations thereof. The heat dissipation element 500 encloses the frame 400 with an inner surface directly contacting the frame 400 and an exposed surface 520 to dissipate heat generated by the OLED module 20. The exposed surface 520 has a large surface area. The heat dissipation element 500 can be Al, Al—Cu alloy, Mg, Mg—Al alloy, stainless steel, galvanized iron, tin coated iron plate, or combinations thereof.

Fourth Embodiment

Figure 5A:
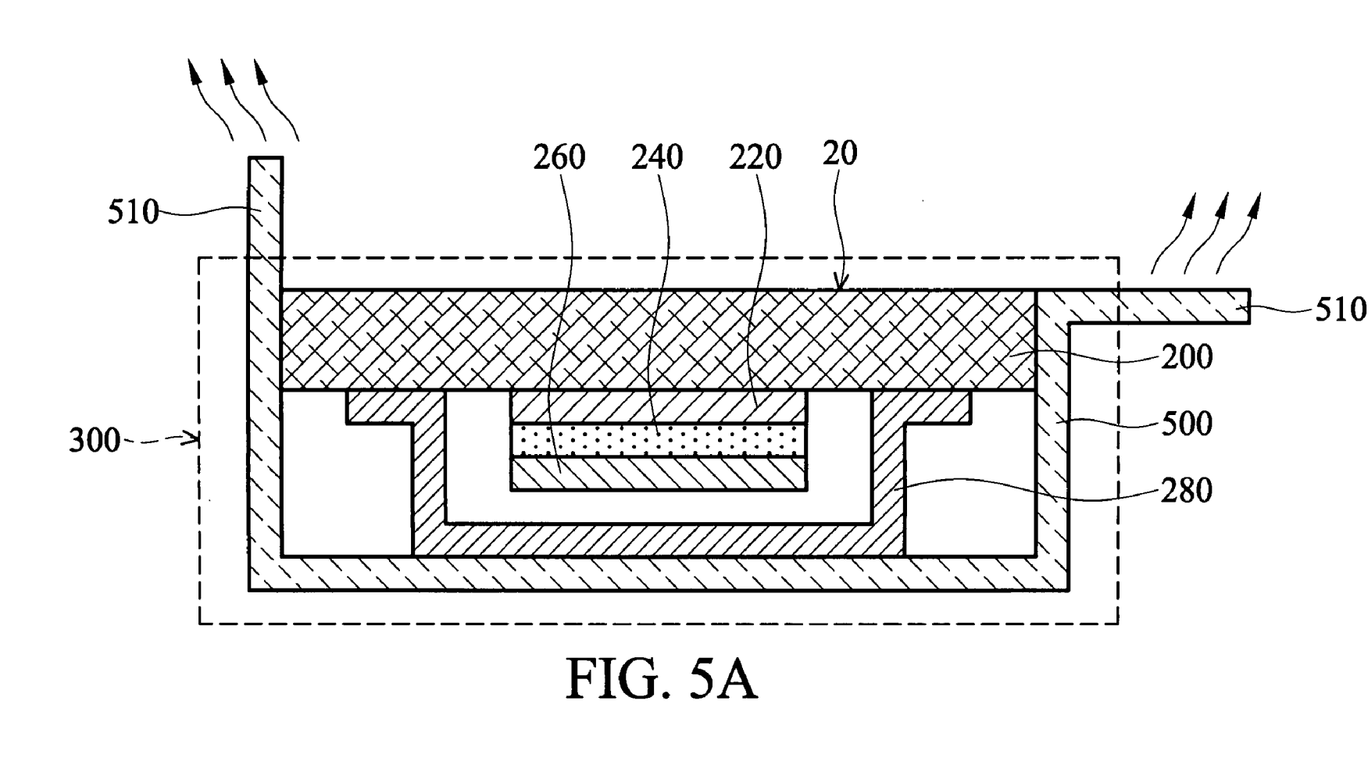
FIG. 5A is a schematic view of an electronic device according to a fourth embodiment of the invention.
Figure 5B:
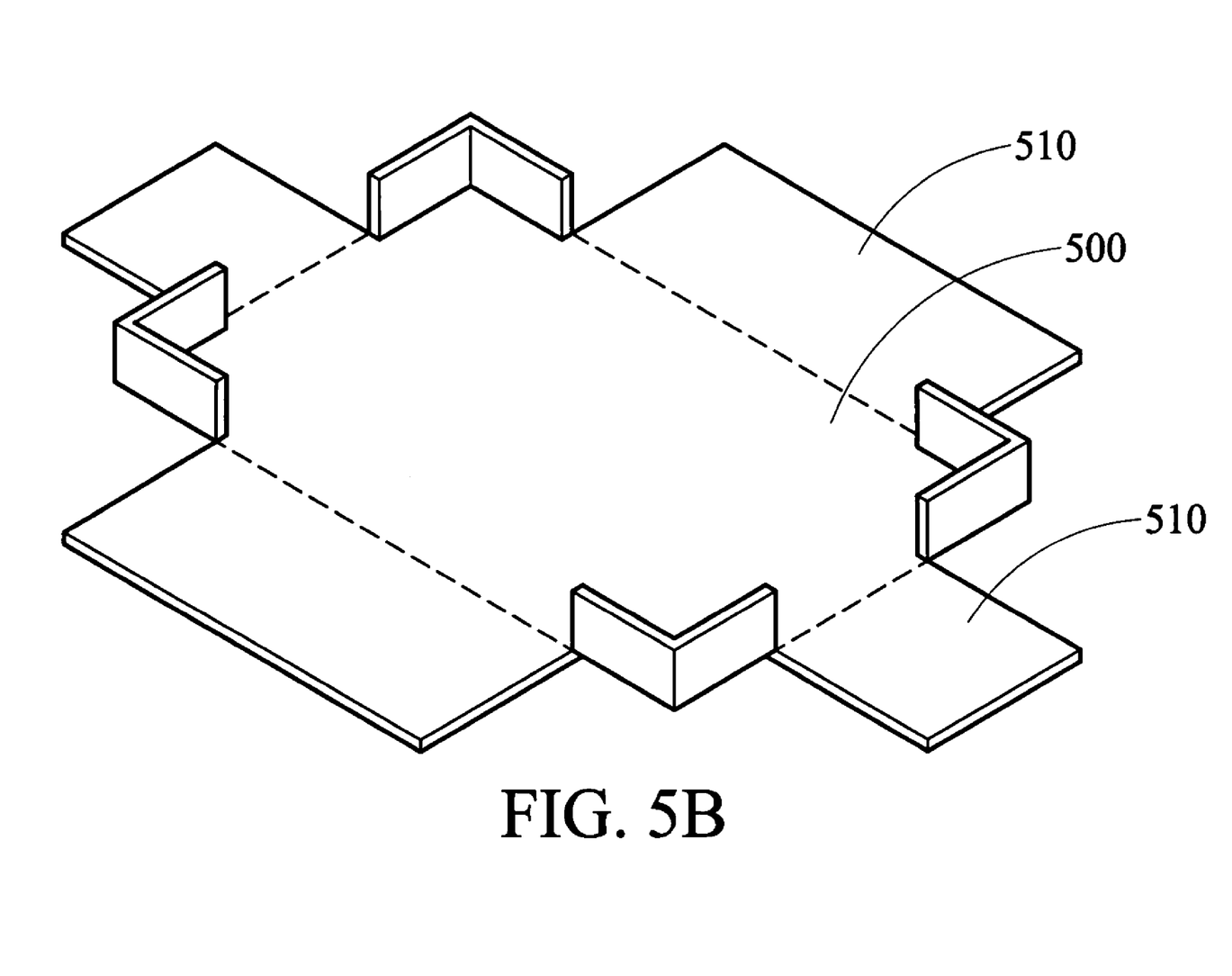
FIG. 5B is a schematic view of the structure of the extended portion of the heat dissipation frame.

FIG. 5A is a schematic view of an electronic device 300 according to a fourth embodiment of the invention. The electronic device 300 comprises an OLED module 20, and a heat dissipation frame 400. The OLED module 20 comprises a substrate 200, a first electrode 220, an organic light emitting layer 240, a second electrode 260, and a passivation structure 280. The OLED module 20 has an exposed surface to dissipate heat generated by the OLED module 20 to ambient environment outside of the electronic device 300. The heat dissipation frame 500 comprises an extending portion 510 extending to outside the electronic device 300. The structure of the extending portion 510 of the heat dissipation frame 500 is shown in FIG. 5B.

Fifth Embodiment

Figure 6:
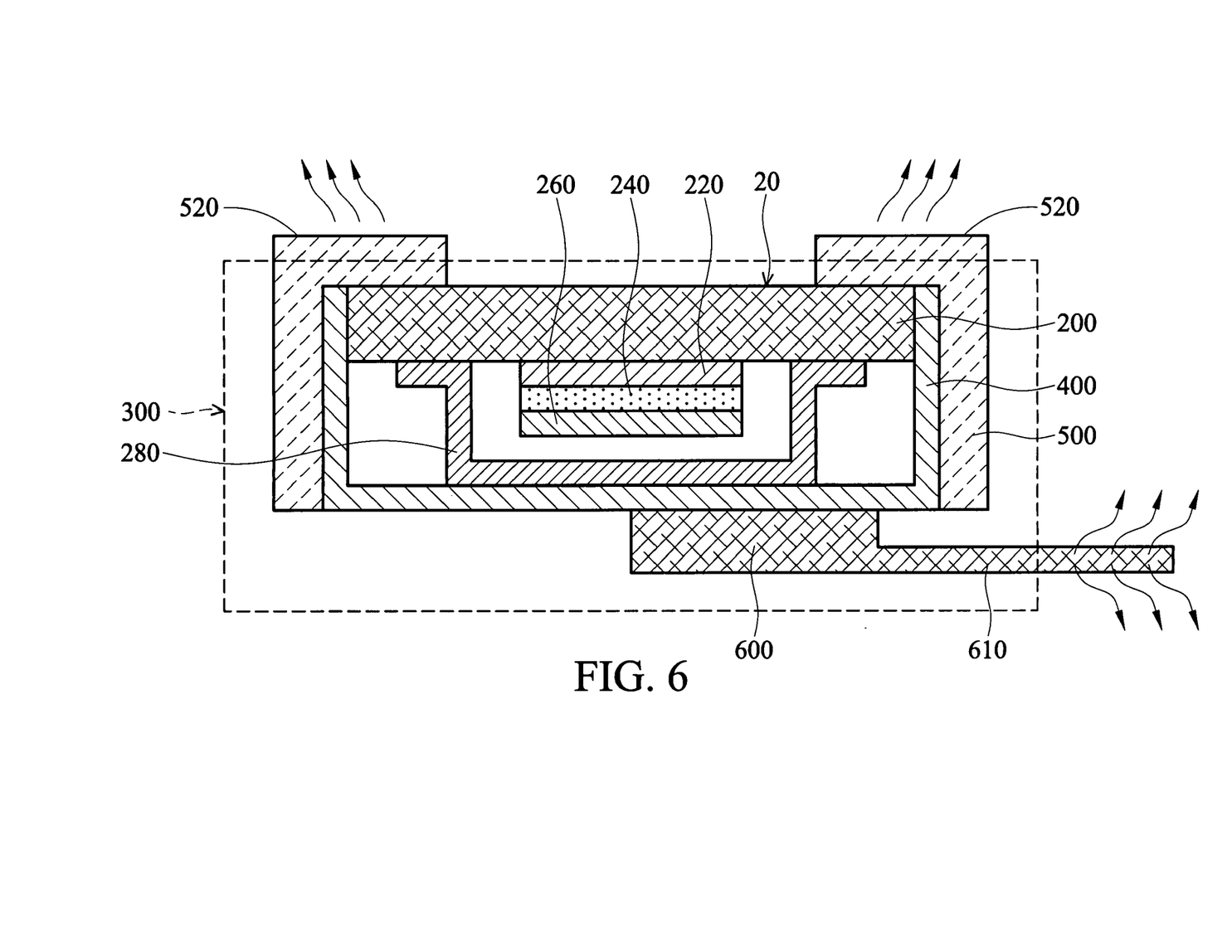
FIG. 6 is a schematic view of an electronic device according to a fifth embodiment of the invention.

FIG. 6 is a schematic view of an electronic device 300 according to a fifth embodiment of the invention. The electronic device 300 comprises an OLED module 20, a frame 400, a heat dissipation element 500, and heat conducting element 600. The OLED module 20 comprises a substrate 200, a first electrode 220, an organic light emitting layer 240, a second electrode 260, and a passivation structure 280. The OLED module 20 is mounted in the frame 400. The heat dissipation element 500 encloses the frame 400 with an inner surface directly contacting the frame 400 and an exposed surface 520 to dissipate heat generated by the OLED module 20 to ambient environment outside the electronic device 300. The exposed surface 520 has a large surface area, thereby effectively dissipating heat generated by the OLED module 20.

The heat conducting 600 directly contacts the frame 400 comprising an extending portion 610 extending to the ambient environment outside the electronic device 300.

While the invention has been described by way of example and in terms of preferred embodiment, it is to be understood that the inventions is not limited thereto. To the contrary, it is intended to cover various modifications and similar arrangements (as would be apparent to those skilled in the art). Thus, the scope of the appended claims should be accorded the broadest interpretations so as to encompass all such modifications and similar arrangements.

What is claimed is:

1. An organic light emitting diode (OLED) device for an electronic device, comprising:
   an organic light emitting diode (OLED) module; and
   an outer frame lined with an inner frame, enclosing the OLED module;
   wherein the frame comprises an exposing portion to outside the electronic device.

2. The OLED device as claimed in claim 1, further comprising a heat dissipating element, wherein one end of the heat dissipating element is disposed on the OLED module and the other end of the heat dissipating element extends outside the electronic device.

3. The OLED device as claimed in claim 1, wherein the outer frame comprises a metal element.

4. The OLED device as claimed in claim 1, wherein the inner frame comprises a first inner frame and a second inner frame, and wherein the first inner frame is mounted in the second inner frame.

5. The OLED device as claimed in claim 1, wherein the inner frame comprises a first inner frame and a second inner frame, and wherein the first inner frame encloses the second inner frame.

6. The OLED device as claimed in claim 4, wherein the first inner frame comprises a metal element.

7. The OLED device as claimed in claim 5, wherein the first inner frame comprises a metal element.

8. The OLED device as claimed in claim 4, wherein the second inner frame comprises a polymer element.

9. The OLED device as claimed in claim 5, wherein the second inner frame comprises a polymer element.

10. The OLED device as claimed in claim 2, wherein the heat dissipating element comprises Al, Al—Cu alloy, Mg, Mg—Al alloy, stainless steel, galvanized iron, tin coated iron plate, or combinations thereof.

11. An organic light emitting diode (OLED) device for an electronic device, comprising:
    an organic light emitting diode (OLED) module;
    an outer frame lined with an inner frame, enclosing the OLED module; and
    a heat dissipating element with one end disposed on the OLED module and the other end extending outside the electronic device.

12. The OLED device as claimed in claim 11, wherein the outer frame comprises a metal element.

13. The OLED device as claimed in claim 11, wherein the inner frame comprises a first inner frame and a second inner frame, and wherein the first inner frame is mounted in the second inner frame.

14. The OLED device as claimed in claim 11, wherein the inner frame comprises a first inner frame and a second inner frame, and wherein the first inner frame encloses the second inner frame.

15. The OLED device as claimed in claim 13, wherein the first inner frame comprises a metal element.

16. The OLED device as claimed in claim 14, wherein the first inner frame comprises a metal element.

17. The OLED device as claimed in claim 13, wherein the second inner frame comprises a polymer element.

18. The OLED device as claimed in claim 14, wherein the second inner frame comprises a polymer element.

19. The OLED device as claimed in claim 11, wherein the heat dissipating element comprises Al, Al—Cu alloy, Mg, Mg—Al alloy, stainless steel, galvanized iron, tin coated iron plate, or combinations thereof.

* * * * *